(12) United States Patent
Cho et al.

(10) Patent No.: US 11,618,955 B2
(45) Date of Patent: Apr. 4, 2023

(54) HYDROGEN EVOLUTION APPARATUS

(71) Applicant: RESEARCH & BUSINESS FOUNDATION SUNGKYUNKWAN UNIVERSITY, Suwon-si (KR)

(72) Inventors: Hyungkoun Cho, Suwon-si (KR); Youngbeen Kim, Ansan-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 17/038,527

(22) Filed: Dec. 21, 2020

(65) Prior Publication Data
US 2021/0115575 A1   Apr. 22, 2021

(30) Foreign Application Priority Data
Feb. 19, 2020   (KR) .................. 10-2020-0020195

(51) Int. Cl.
  *C25B 9/65*   (2021.01)
  *C25B 1/55*   (2021.01)
  (Continued)

(52) U.S. Cl.
  CPC .............. *C25B 9/65* (2021.01); *C01B 19/002* (2013.01); *C23C 14/0623* (2013.01);
  (Continued)

(58) Field of Classification Search
  CPC ................ C25B 1/55; C25B 3/21; C25B 9/50
  See application file for complete search history.

(56) References Cited

U.S. PATENT DOCUMENTS

| 2008/0116080 A1* | 5/2008 | Lal ............................ C25B 1/55 |
| | | 205/334 |
| 2019/0270845 A1* | 9/2019 | Ullah .................... C25B 11/075 |
| (Continued) | | |

FOREIGN PATENT DOCUMENTS

| JP | 2012-505310 A | 3/2012 |
| KR | 10-1816839 B1 | 1/2018 |
| WO | WO-2019012111 A1 * | 1/2019 ........... C07K 14/215 |

OTHER PUBLICATIONS

Kim et al., Interleaved biphasic p-n blended copper indium selenide photoelectrode and its application in pulse-driven photoelectrochemical water splitting, Applied Catalysis B: Environmental, vol. 285, May 2021, 119839, pp. 1-12 (Year: 2021).*

(Continued)

*Primary Examiner* — Harry D Wilkins, III
(74) *Attorney, Agent, or Firm* — NSIP Law

(57) ABSTRACT

The present disclosure relates to a hydrogen evolution apparatus including an AC power source, a semiconductor electrode and a counter electrode connected to the AC power source, an electrolyte in which the semiconductor electrode is immersed, and a light source which irradiates light on the semiconductor electrode, in which the semiconductor electrode includes a conductive substrate and n-type semiconductor particles dispersed on a p-type semiconductor matrix or p-type semiconductor particles dispersed on an n-type semiconductor matrix which is vertically grown from the conductive substrate.

18 Claims, 13 Drawing Sheets

(51) Int. Cl.

| | | |
|---|---|---|
| *C25B 9/17* | (2021.01) | |
| *C25B 11/052* | (2021.01) | |
| *C25B 11/061* | (2021.01) | |
| *C25B 11/091* | (2021.01) | |
| *C23C 14/24* | (2006.01) | |
| *C23C 14/16* | (2006.01) | |
| *C23C 14/58* | (2006.01) | |
| *C23C 14/06* | (2006.01) | |
| *C25B 1/04* | (2021.01) | |
| *C25B 9/50* | (2021.01) | |
| *C25B 11/087* | (2021.01) | |
| *C25D 5/50* | (2006.01) | |
| *C23C 28/00* | (2006.01) | |
| *C01B 19/00* | (2006.01) | |

(52) U.S. Cl.
CPC .............. *C23C 14/16* (2013.01); *C23C 14/24* (2013.01); *C23C 14/5806* (2013.01); *C23C 28/322* (2013.01); *C23C 28/34* (2013.01); *C25B 1/04* (2013.01); *C25B 1/55* (2021.01); *C25B 9/17* (2021.01); *C25B 9/50* (2021.01); *C25B 11/052* (2021.01); *C25B 11/061* (2021.01); *C25B 11/087* (2021.01); *C25B 11/091* (2021.01); *C25D 5/50* (2013.01); *C01P 2006/40* (2013.01)

(56) References Cited

U.S. PATENT DOCUMENTS

| | | | |
|---|---|---|---|
| 2020/0190114 A1* | 6/2020 | Sohail | ............... C07F 3/003 |
| 2020/0347496 A1* | 11/2020 | Ehsan | ............... H01G 9/2022 |
| 2020/0347501 A1* | 11/2020 | Ehsan | ............... C25B 11/0773 |

OTHER PUBLICATIONS

Kim, Joo Sung et al. "Copper Indium Selenide Water Splitting Photoanodes with Artificially Designed Heterophasic Blended Structure and Their High Photoelectrochemical Performances" *Nano Energy* vol. 46 Jan. 17, 2018, (21 pages in English).

Korean Office Action dated Jul. 6, 2021 in counterpart Korean Patent Application No. 10-2020-0020195 (6 pages in Korean).

\* cited by examiner

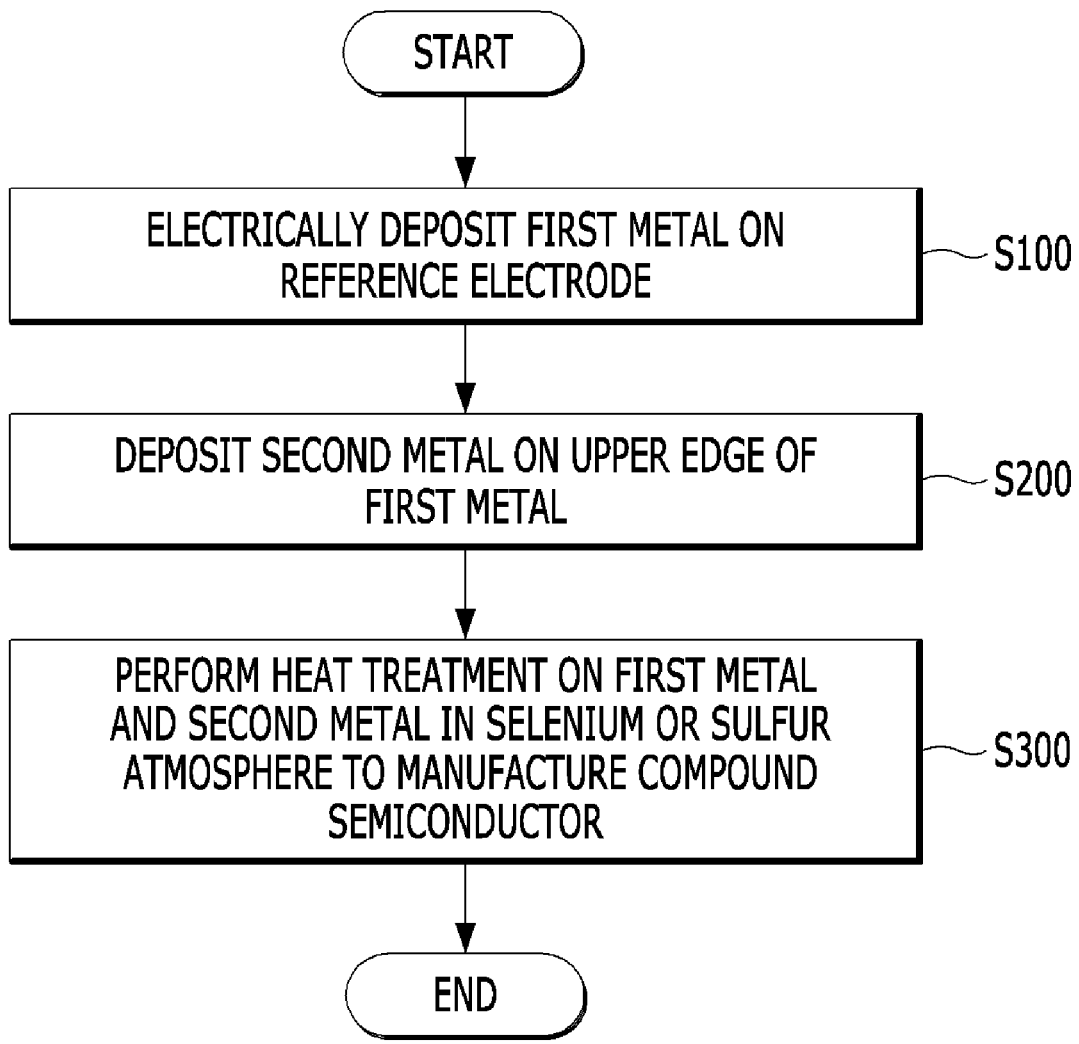
[FIG. 6]

[FIG. 7]
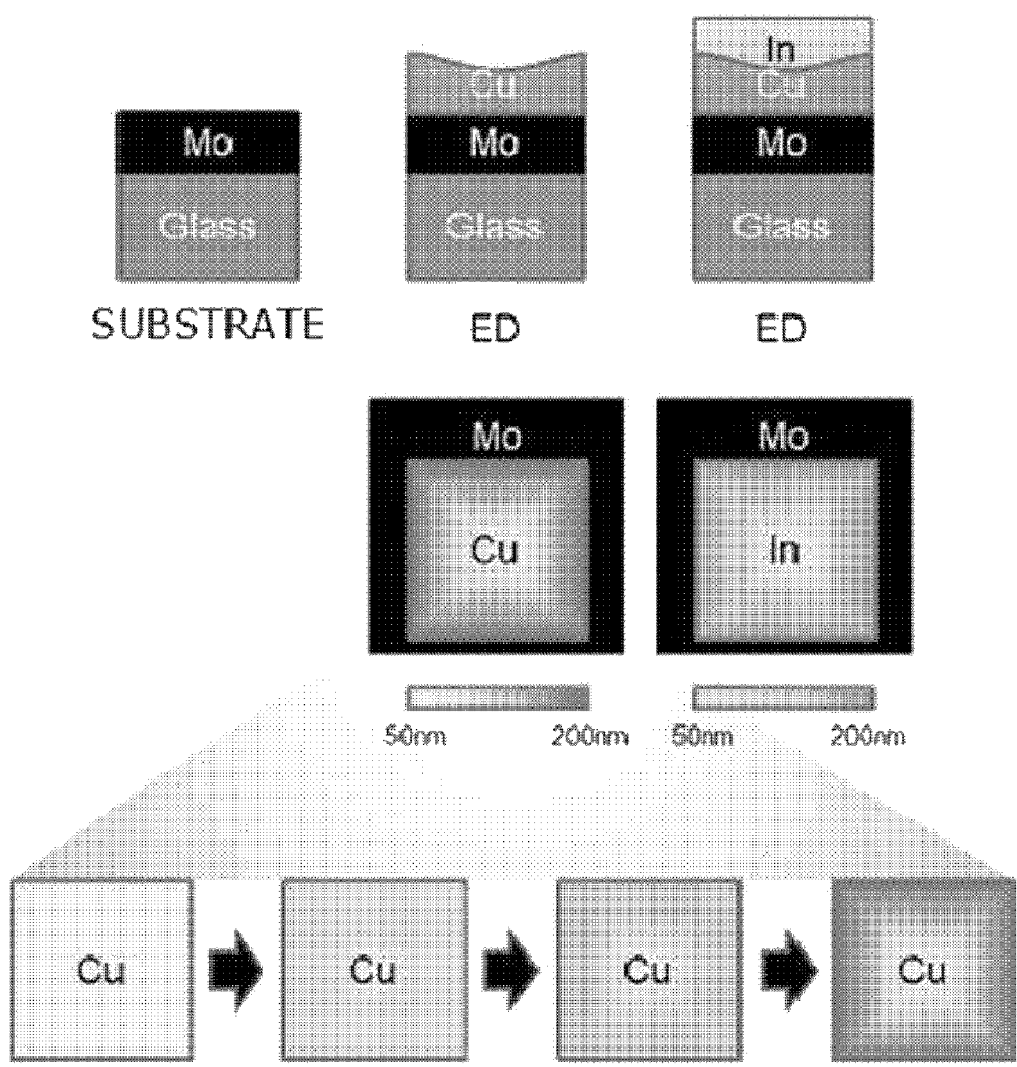

[FIG. 8]
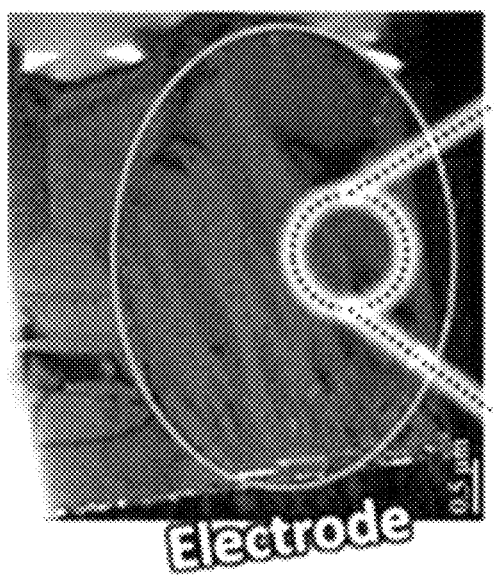
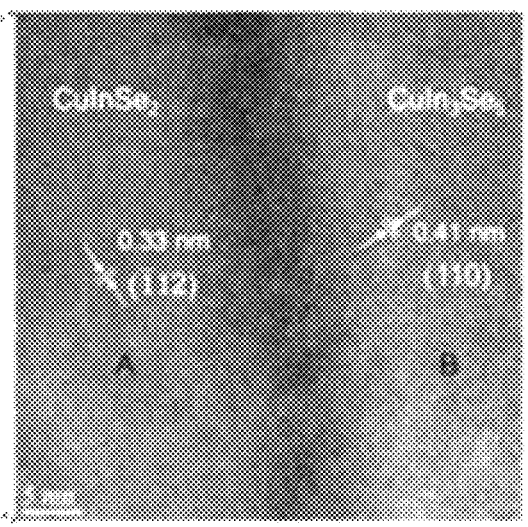
p-type CuInSe₂           n-type CuIn₃Se₅
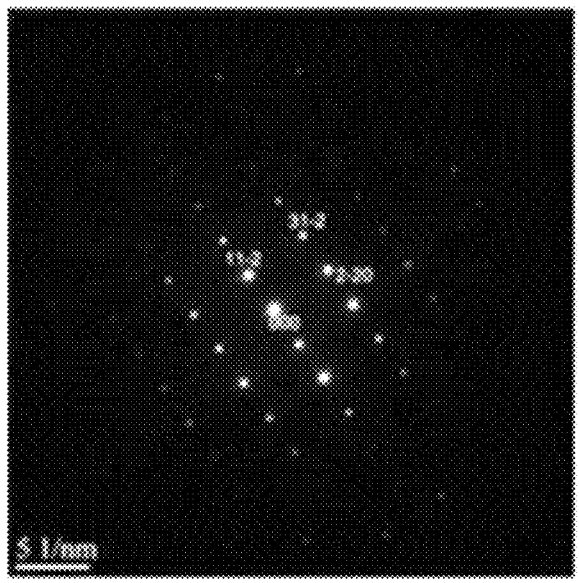
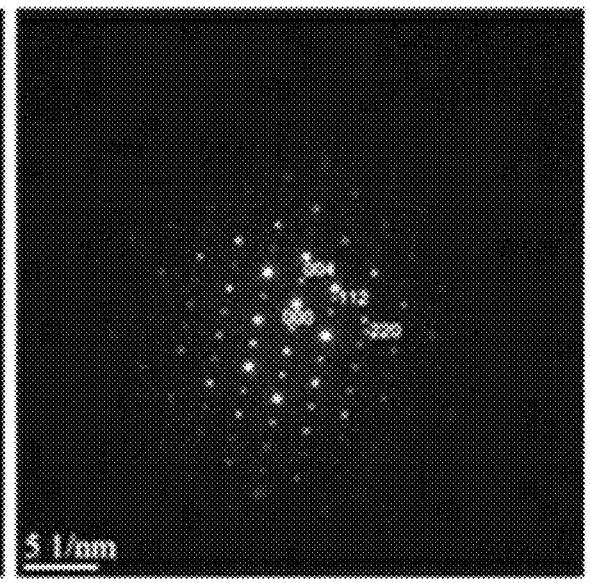
[111]           Z.A.=[110]

[FIG. 11]

HYDROGEN EVOLUTION APPARATUS

CROSS-REFERENCE TO RELATED APPLICATIONS

This application claims the priority of Korean Patent Application No. 10-2019-0122813 filed on Oct. 4, 2019 and Korean Patent Application No. 10-2020-0020195 filed on Feb. 19, 2020, in the Korean Intellectual Property Office, the disclosure of which is incorporated herein by reference.

BACKGROUND

Field

The present disclosure relates to a hydrogen evolution apparatus.

Description of the Related Art

In modern times, the level of life is consistently improved with the development of industrial technology, but due to the rapid increase of energy use, the problems of the environmental pollution and resource depletion are becoming serious more and more. In order to solve the problems of the environmental pollution and the resource depletion, each country is focusing on the development of clean fuels. In particular, the development of a clean alternative energy using hydrogen as an energy source is attracting great interest.

Hydrogen is a high density clean energy source and is attracting attention as a next-generation alternative energy source. A photoelectrochemical hydrogen evolution apparatus of the related art generates hydrogen using a DC power source and a single conductive semiconductor light absorbing layer which uses platinum (Pt) as a catalyst. However, when the voltage is continuously applied to the light absorbing layer of the hydrogen evolution apparatus of the related art, it is difficult to consistently produce the hydrogen due to the corrosion phenomenon caused by the accumulation of photo charges generated by the light and a limitation of a photo charge producing efficiency. The hydrogen evolution apparatus of the related art needs to directly use the DC power source or requires a process of converting an AC power source into a DC power source so that AC electricity or an AC energy source cannot be directly utilized to produce hydrogen.

Specifically, when an electrode of the hydrogen evolution apparatus of the related art is immersed in the water and light with a specific wavelength and a predetermined level of voltage are applied to the electrode, electrons of the electrode react with $H^+$ ions in the water to produce hydrogen. However, when the DC power source is used, the number of electrons in the electrode is continuously increased so that the electrode is corroded by water over the time, which may degrade the efficiency of the hydrogen evolution apparatus.

Korean Registered Patent Publication No. 10-1816839 which is a background of the present disclosure relates to a complex power circuit for renewable energy directly connected hydrogen generating device and a control method thereof. However, according to the above-mentioned registered patent, the AC power source is converted into the DC power source to generate hydrogen, but a method of generating hydrogen without converting the AC power source into the DC power source has not been recognized.

SUMMARY

An object of the present disclosure is to solve the problems of the related art and to provide a hydrogen evolution apparatus using an AC power source.

Another object of the present disclosure is to provide a manufacturing method of a semiconductor electrode of the hydrogen evolution apparatus.

However, objects to be achieved by various embodiments of the present disclosure are not limited to the technical objects as described above and other technical objects may be present.

As a technical means to achieve the above-described technical object, an aspect of the present disclosure provides a hydrogen evolution apparatus including: an AC power source; a semiconductor electrode and a counter electrode connected to the AC power source; an electrolyte in which the semiconductor electrode is immersed; and a light source which irradiates light on the semiconductor electrode, in which the semiconductor electrode includes a conductive substrate and an n-type semiconductor and/or a p-type semiconductor which is vertically grown from the conductive substrate.

According to an implementation example of the present disclosure, the semiconductor electrode may have a three-dimensional heterojunction structure in which the n-type semiconductors and the p-type semiconductors are alternately disposed, but it is not limited thereto.

According to an implementation example of the present disclosure, the semiconductor electrode may include n-type semiconductor particles dispersed on a p-type semiconductor matrix or p-type semiconductor particles dispersed on an n-type semiconductor matrix, but it is not limited thereto.

According to an implementation example of the present disclosure, the semiconductor electrode may have a three-dimensional heterojunction structure in which the n-type semiconductor matrix and the p-type semiconductor matrix are alternately disposed, but it is not limited thereto.

According to an implementation example of the present disclosure, the n-type semiconductor and the p-type semiconductor may independently include a material selected from a group consisting of a Cu—In—Se based material, a Cu—In—S based material, a Cu—Sb—Se based material, a Cu—Sb—S based material, a Zn—In—Se based material, a Zn—In—S based material, a Zn—Sb—Se based material, a Zn—Sb—S based material, and a combination thereof, but are not limited thereto.

According to an implementation example of the present disclosure, in the n-type semiconductor, a composition ratio of Cu—In—Se is 1:3:5 and in the p-type semiconductor, a composition ratio of Cu—In—Se is 1:1:2, but are not limited thereto.

According to an implementation example of the present disclosure, the AC power source may apply a voltage of −1.0 V to +1.5 V onto the conductive substrate, but is not limited thereto.

According to an implementation example of the present disclosure, hydrogen may be generated on the electrolyte by light irradiated from the light source and/or the voltage applied to the semiconductor electrode, but is not limited thereto.

According to an implementation example of the present disclosure, hydrogen may be generated from a surface of the p-type semiconductor by a negative voltage applied from the AC power source and the hydrogen may be coupled to the surface of the p-type semiconductor, but is not limited thereto.

According to an implementation example of the present disclosure, hydrogen coupled onto the surface of the p-type semiconductor may be released by a positive voltage applied from the AC power source, but is not limited thereto.

According to an implementation example of the present disclosure, a frequency of the AC power source may be 0.01 Hz to 30 Hz, but is not limited thereto.

According to an implementation example of the present disclosure, the conductive substrate and the counter electrode may independently include a material selected from a group consisting of Mo, Au, Pt, Ti, Ag, Ni, Zr, Ta, Zn, Nb, Cr, Co, Mn, Fe, Al, Mg, Si, W, Cu, lanthanum metals, nitrides thereof, oxides thereof, conductive polymers, and a combination thereof, but are not limited thereto.

According to an implementation example of the present disclosure, an energy source of the AC power source may include an energy source selected from a group consisting of a solar cell, a piezoelectric device, a thermoelectric device, a triboelectricity, a photoelectric device, a ferrofluid, and a combination thereof, but is not limited thereto.

According to an implementation example of the present disclosure, a wavelength of irradiated light is 300 nm to 900 nm, but is not limited thereto.

Further, a manufacturing method of a semiconductor electrode which is an aspect of the present disclosure is a manufacturing method of a semiconductor electrode of the hydrogen evolution apparatus including: a step of electrically depositing a first metal on the conductive substrate; a step of depositing a second metal at an upper edge of the first metal; and performing heat treatment on the first metal and the second metal in the selenium or sulfur atmosphere to manufacture a compound semiconductor, in which an atomic composition ratio of the first metal and second metal is 0.3 to 1.0.

According to an implementation example of the present disclosure, during the step of electrically depositing, a voltage applied to the first metal may be −0.6 V to −0.3 V, but is not limited thereto.

According to an implementation example of the present disclosure, the first metal may include Cu or Zn and the second metal may include In or Sb, but is not limited thereto.

According to an implementation example of the present disclosure, the compound semiconductor may include a material selected from a group consisting of a Cu—In—Se based material, a Cu—In—S based material, a Cu—Sb—Se based material, a Cu—Sb—S based material, a Zn—In—Se based material, a Zn—In—S based material, a Zn—Sb—Se based material, a Zn—Sb—S based material, and a combination thereof, but is not limited thereto.

According to an implementation example of the present disclosure, the step of depositing of a second metal is performed by a process including a method selected from a group consisting of electrodeposition, chemical vapor deposition, physical vapor deposition, atomic layer deposition, and a combination thereof, but is not limited thereto, but is not limited thereto.

According to an implementation example of the present disclosure, a heat treatment temperature may be 450° C. to 650° C., but is not limited thereto.

The above-described solving means are merely illustrative but should not be construed as limiting the present disclosure. In addition to the above-described exemplary embodiments, additional embodiments may be further provided in the drawings and the detailed description of the present disclosure.

Since the hydrogen evolution apparatus of the related art uses a DC power source, a circuit for converting an AC power source into a DC power source is additionally provided. However, according to the above-described solving means of the present disclosure, the hydrogen evolution apparatus according to the present disclosure may produce hydrogen using an AC current so that the structure thereof may be simpler than that of the hydrogen evolution apparatus of the related art.

Further, a voltage applied to the hydrogen evolution apparatus according to the present disclosure has an AC signal type so that an energy band bending phenomenon which changes in a short time is generated to suppress a recoupling process of charges and suppress the loss of the photocurrent of the hydrogen evolution apparatus.

When a DC voltage is consistently applied to the hydrogen evolution apparatus of the related art, the reduction of the photocurrent due to an interface electrochemical phenomenon generated on the electrode surface over the time, that is, the electrical double layer may be easily observed. Accordingly, in the hydrogen evolution apparatus of the related art, a necessary voltage of a photoelectrode which produces hydrogen is increased more than the theoretical predicted value due to the electrical double layer and corrosion of the photoelectrode may be accelerated.

However, the hydrogen evolution apparatus according to the present disclosure uses an AC power source so that the electrical double layer formation may be suppressed from the surface of the electrode of the hydrogen evolution apparatus and a voltage required to produce hydrogen may be reduced.

Specifically, in the photoelectrode of the hydrogen evolution apparatus, the n-type semiconductors and the p-type semiconductors are alternately disposed so that the recoupling of the charges is suppressed and the charge transport efficiency may be improved. Further, a direction of the energy band bending is quickly changed so that a phenomenon that the charges are accumulated in the photoelectrode is suppressed. Therefore, the electrical double layer phenomenon and the corrosion of the photoelectrode may be suppressed.

A system of producing hydrogen using the hydrogen evolution apparatus according to the present disclosure requires a very small amount of electrical energy by utilizing a solar energy which is a renewable energy and suppressing the electrical double layer so that an energy source of the AC power source of the hydrogen evolution apparatus may be an energy harvesting device such as a solar cell, a thermoelectric device, a piezoelectric device, a photoelectric device, or ferrofluid, which enables eco-friendly power generation.

Further, the hydrogen evolution apparatus of the related art uses a DC power source and uses a material having a single conductivity and a single phase as an electrode so that a material which can be used for the photoelectrode device is limited. In contrast, the hydrogen evolution apparatus according to the present disclosure uses a material with a polyphase complex structure so that a range of a material which can be used for the photoelectrode element is wide. Therefore, various materials may be used.

Further, when a high positive voltage is applied to the hydrogen evolution apparatus according to the present disclosure, oxygen may be generated so that an applicable range of the hydrogen evolution apparatus may be expanded to a device for supplying hydrogen and oxygen to a fuel cell.

However, the effect which can be achieved by the present disclosure is not limited to the above-described effects, there may be other effects.

BRIEF DESCRIPTION OF DRAWINGS

The above and other aspects, features and other advantages of the present disclosure will be more clearly understood from the following detailed description taken in conjunction with the accompanying drawings, in which:

(a) and (b) of FIG. 1 are cross-sectional views of a semiconductor electrode according to an implementation example of the present disclosure;

FIG. 6 is a flowchart illustrating a manufacturing method of a semiconductor electrode according to an implementation example of the present disclosure;

FIG. 7 is a diagram illustrating a manufacturing method of a semiconductor electrode according to an implementation example of the present disclosure;

FIG. 8 is a TEM image and a selected area electron diffraction (SAED) image of a semiconductor electrode according to an exemplary embodiment of the present disclosure;

DETAILED DESCRIPTION OF THE EMBODIMENT

Figure 1:
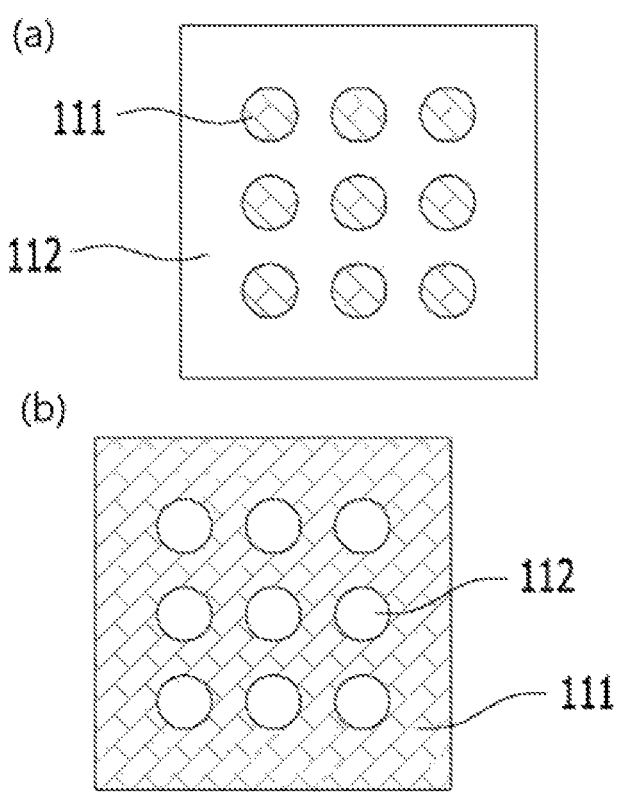

Hereinafter, the present disclosure will be described more fully hereinafter with reference to the accompanying drawings, in which exemplary embodiments of the present disclosure are shown.

However, the present disclosure can be realized in various different forms, and is not limited to the embodiments described herein. Accordingly, in order to clearly explain the present disclosure in the drawings, portions not related to the description are omitted. Like reference numerals designate like elements throughout the specification.

Throughout this specification and the claims that follow, when it is described that an element is "coupled" to another element, the element may be "directly coupled" to the other element or "electrically coupled" to the other element through a third element.

Through the specification of the present disclosure, when one member is located "on", "above", "on an upper portion", "below", "under", and "on a lower portion" of the other member, the member may be adjacent to the other member or a third member may be disposed between the above two members.

In the specification of the present disclosure, unless explicitly described to the contrary, the word "comprise" and variations such as "comprises" or "comprising", will be understood to imply the inclusion of stated elements but not the exclusion of any other elements.

The terms "about or approximately" or "substantially" indicating a degree used throughout the specification are used as a numerical value or a meaning close to the numerical value when a unique manufacturing and material tolerance is proposed to the mentioned meaning and also used to prevent unscrupulous infringers from wrongfully using the disclosure in which precise or absolute numerical values are mentioned for better understanding of the present disclosure. Terms used throughout the specification, "~step of ~ing" or "step of~" do not mean "step for~".

Throughout the specification of the present disclosure, the term "combination thereof" included in the expression of Markushi format refers to a mixture or a combination of one or more selected from a group consisting of components described in the expression of the Markushi format and it means that one or more selected from the group consisting of the components is included.

Throughout the specification of the present disclosure, the description of "A and/or B" refers to "A or B" or "A and B".

Throughout the specification of the present disclosure, the description of "vertically growing" includes not only an angle between a growing direction of a material on a substrate and the substrate which is exactly 90°, but also the angle which is approximately 70° to 110°.

Hereinafter, a hydrogen evolution apparatus of the present disclosure will be described in detail with reference to implementation examples, exemplary embodiments, and drawings. However, the present disclosure is not limited to the implementation examples, the exemplary embodiments, and the drawings.

As a technical means to achieve the above-described technical object, an aspect of the present disclosure provides a hydrogen evolution apparatus 10 including an AC power source 200, a semiconductor electrode 100 and a counter electrode 300 connected to the AC power source 200, an electrolyte 400 in which the semiconductor electrode 100 is immersed, and a light source (not illustrated) which irradiates light onto the semiconductor electrode 100. The semiconductor electrode 100 includes a conductive substrate 110 and a p-type semiconductor 111 and an n-type semiconductor 112 which are vertically grown from the conductive substrate 110 to be arranged. The semiconductor electrode 110 has a three-dimensional heterojunction structure in which the p-type semiconductors 111 and the n-type semiconductors 112 are alternately disposed.

An aspect of the present disclosure provides a hydrogen evolution apparatus 10 including an AC power source 200, a semiconductor electrode 100 and a counter electrode 300 connected to the AC power source 200, an electrolyte 400 in which the semiconductor electrode 100 is immersed, and a light source (not illustrated) which irradiates light onto the semiconductor electrode 100. The semiconductor electrode 100 includes a conductive substrate 110 and n-type semiconductor 112 particles dispersed on a p-type semiconductor 111 matrix or p-type semiconductor 111 particles dispersed on the n-type semiconductor 112 matrix which is vertically grown from the conductive substrate 110.

According to an implementation example of the present disclosure, the semiconductor electrode 100 may have a three-dimensional heterojunction structure in which the n-type semiconductor 112 matrix and the p-type semiconductor 111 matrix are alternately disposed, but is not limited thereto. For example, the semiconductor electrode 100 may include a structure in which the p-type semiconductors 111 and the n-type semiconductors 112 are alternately disposed, a structure in which the n@p semiconductor matrix and the p@n semiconductor matrix are alternately disposed, a structure in which the p-type semiconductors 111 and the p@n semiconductor matrix are alternately disposed, or a structure in which the n-type semiconductors 112 and the n@p semiconductor matrix are alternately disposed.

(a) and (b) of FIG. 1 are cross-sectional views of a semiconductor electrode 100 according to an implementation example of the present disclosure.

Referring to FIG. 1, the semiconductor electrode 100 of the hydrogen evolution apparatus 10 may include the p-type semiconductor 111 matrix in which n-type semiconductor 112 particles are dispersed or the n-type semiconductor 112 matrix in which p-type semiconductor 111 particles are dispersed. Hereinafter, in the present disclosure, the p-type semiconductor matrix in which n-type semiconductor particles are dispersed is denoted as an n@p semiconductor matrix and the n-type semiconductor matrix in which p-type semiconductor particles are dispersed is denoted as a p@n semiconductor matrix.

With regard to this, a section of the semiconductor electrode 100 is vertically grown on the conductive substrate 110 so that the section of the semiconductor electrode 100 may have a horizontal parallel structure in which the p-type semiconductors 111 and the n-type semiconductors 112 are alternately disposed, a horizontal parallel structure in which the n@p semiconductor matrix and the p@n semiconductor matrix are alternately disposed, a horizontal parallel structure in which the p-type semiconductors 111 and the p@n semiconductor matrix are alternately disposed, or a horizontal parallel structure in which the n-type semiconductors 112 and the n@p semiconductor matrix are alternately disposed.

According to an implementation example of the present disclosure, angles at which the p-type semiconductor 111, the n-type semiconductor 112, the n@p semiconductor matrix, and the p@n semiconductor matrix are grown on a surface of the conductive substrate 110 are independently 70° to 110°, but are not limited thereto. Desirably, the p-type semiconductor 111, the n-type semiconductor 112, the n@p semiconductor matrix, and the p@n semiconductor matrix may be vertically grown on the surface of the conductive substrate 110, but are not limited thereto.

With regard to this, in FIGS. 2 to 7, the reference numeral 111 which denotes the p-type semiconductor may include not only the p-type semiconductor, but also the n@p semiconductor matrix, and the reference numeral 112 which denotes the n-type semiconductor may include not only the n-type semiconductor, but also the p@n semiconductor matrix. Hereinafter, if it is not specifically mentioned, the p-type semiconductor 111 may include a particle including a p-type semiconductor, a matrix including a p-type semiconductor, and an n@p semiconductor matrix and the n-type semiconductor 112 may include a particle including an n-type semiconductor, a matrix including an n-type semiconductor, and a p@n semiconductor matrix.

For example, the p-type semiconductor 111 and the n-type semiconductor 112 are vertically grown on the conductive substrate 110 so that the section of the semiconductor electrode 100 may have a horizontal parallel structure in which the p-type semiconductors 111 and the n-type semiconductors 112 are alternately disposed.

Figure 2:
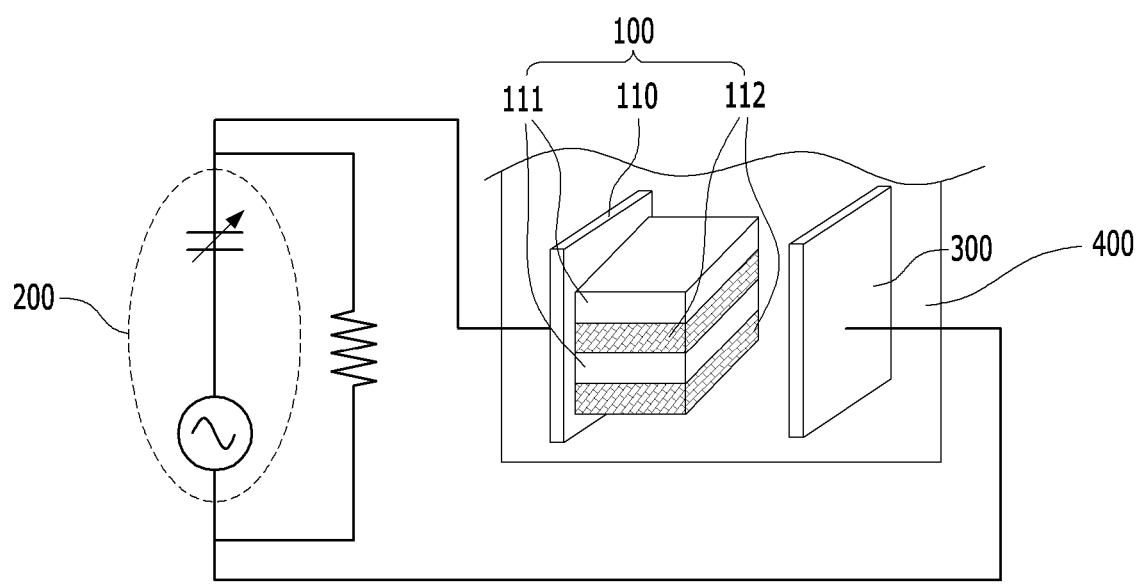
FIG. 2 is a diagram of a hydrogen evolution apparatus according to one implementation example of the present disclosure.

FIG. 2 is a diagram of a hydrogen evolution apparatus according to an implementation example of the present disclosure.

Referring to FIG. 2, the semiconductor electrode 100 and the counter electrode 300 may be immersed in the electrolyte 400 or may be in contact with the electrolyte 400, but are not limited thereto. When the semiconductor electrode 100 and the counter electrode 300 are immersed in the electrolyte 400, the AC power source 200 may be provided at the outside of the electrolyte 400, but is not limited thereto.

According to an implementation example of the present disclosure, the p-type semiconductor 111 and the n-type semiconductor 112 may independently include a material selected from a group consisting of a Cu—In—Se based material, a Cu—In—S based material, a Cu—Sb—Se based material, a Cu—Sb—S based material, a Zn—In—Se based material, a Zn—In—S based material, a Zn—Sb—Se based material, a Zn—Sb—S based material, and a combination thereof, but are not limited thereto. Desirably, the p-type semiconductor 111 and the n-type semiconductor 112 may include Cu—In—Se based materials with different compositions, respectively, but are not limited thereto.

According to an implementation example of the present disclosure, in the n-type semiconductor 112, a composition ratio of Cu—In—Se may be 1:3:5 and in the p-type semiconductor 111, a composition ratio of Cu—In—Se may be 1:1:2, but is not limited thereto.

For example, when the n-type semiconductor 112 is a Cu—In—Se based semiconductor, an atomic composition ratio of copper, indium, and selenium may be 1:3:5. Further, for example, when the n-type semiconductor 112 is a Zn—In—Se based semiconductor, the composition ratio is 1:2:4, when the n-type semiconductor 112 is a Zn—In—S based semiconductor, the composition ratio is 1:2:4, and when the n-type semiconductor 112 is a Cu—In—S based semiconductor, the composition ratio is 1:1:2.

For example, when the p-type semiconductor 111 is a Cu—In—Se based semiconductor, a composition ratio of atoms may be 1:1:2. Further, for example, when the p-type semiconductor 111 is a Zn—In—Se based semiconductor, a composition ratio is 1:1:2, when the p-type semiconductor 111 is a Zn—In—S based semiconductor, a composition ratio is 1:2:4, when the p-type semiconductor 111 is a Cu—In—S based semiconductor, a composition ratio is 1:1:2, when the p-type semiconductor 111 is a Cu—Sb—Se based semiconductor, a composition ratio is 1:1:2, and when the p-type semiconductor 111 is a Cu—Sb—S based semiconductor, a composition ratio is 1:1:2.

The Cu—In—Se based material is referred to as a CIS material. The CIS material may be used as a light absorbing layer of the thin film solar cell and is used as a material which decomposes water in the hydrogen evolution apparatus 10.

Unlike a semiconductor of the related art in which the p-n junction is configured as a laminated type, the semiconductor electrode 100 of the present disclosure may have a structure which simultaneously includes the p-type semiconductor 111 and the n-type semiconductor 112, like the p@n semiconductor matrix or the n@p semiconductor matrix. By the p-type semiconductor 111 and the n-type semiconductor 112, the semiconductor electrode 100 is influenced by the voltage applied from the AC power source 200 at all times to generate hydrogen or oxygen. Further, it is confirmed that significant photocurrent is generated from the semiconductor electrode 100 by a process of generating hydrogen or oxygen.

According to an implementation example of the present disclosure, the AC power source 200 may apply a voltage of −1.0 V to +1.5 V onto the conductive substrate 110, but is not limited thereto.

For example, a voltage which is applied onto the conductive substrate 110 by the AC power source 200 is approximately −1.00 V to approximately +1.50 V, approximately −0.75 V to approximately +1.50 V, approximately −0.50 V to approximately +1.50 V, approximately −0.25 V to approximately +1.50 V, approximately +0.00 V to approximately +1.50 V, approximately +0.25 V to approximately +1.50 V, approximately +0.50 V to approximately +1.50 V, approximately +0.75 V to approximately +1.50 V, approximately +1.25 V to approximately +1.50 V, approximately −1.00 V to approximately +1.25 V, approximately −1.00 V to approximately +1.00 V, approximately −1.00 V to approximately +0.75 V, approximately −1.00 V to approximately +0.50 V, approximately −1.00 V to approximately +0.25 V, approximately −1.00 V to approximately 0.00 V, approximately −1.00 V to approximately −0.25 V, approximately −1.00 V to approximately −0.50 V, approximately −1.00 V to approximately −0.75 V, approximately −0.75 V to approximately +1.25 V, approximately −0.50 V to approximately +1.00 V, approximately −0.25 V to approximately +0.75 V, approximately 0.00 V to approximately +0.50 V, or approximately +0.25 V, but is not limited thereto.

Theoretically, a minimum energy required to decompose water into hydrogen and oxygen is approximately 1.23 V. However, the required energy is increased due to an electrical double layer generated on the surface of the electrode so that an energy of approximately 1.45 V is necessary to decompose water into hydrogen and oxygen. When light is irradiated onto a surface of the electrode, a theoretical value of a minimum voltage to decompose water may be less than 1.23 V by the photovoltage generated in a photoelectrode layer. Therefore, a required voltage is reduced so that a problem caused by the electrical double layer may be solved.

Since the hydrogen evolution apparatus 10 according to the present disclosure includes the AC power source 200, the problem caused by the electrical double layer is further solved and thus, the energy loss problem generated during the hydrogen generating process may be minimized.

According to an implementation example of the present disclosure, a frequency of the AC power source 200 may be 0.01 Hz to 30 Hz, but is not limited thereto.

According to an implementation example of the present disclosure, hydrogen may be generated on the electrolyte 400 by light irradiated from the light source and/or a voltage applied to the semiconductor electrode 100, but it is not limited thereto.

The electrolyte according to the present disclosure receives electric energy or light energy to generate hydrogen and may include a material which simultaneously includes $H^+$ ion and $OH^-$ ion, for example, water.

Specifically, when the voltage is applied to the semiconductor electrode 100, an energy band bending of the p-type semiconductor 111 or the n-type semiconductor 112 is generated. In this case, when light is irradiated onto the semiconductor electrode 100, electrons of the p-type semiconductor 111 or holes of the n-type semiconductor 112 are excited by the light to have energy. Charges which receive the energy react with the electrolyte 400, for example, $H^+$ ions or $OH^-$ ions dispersed in the water to generate hydrogen or oxygen.

As it will be described below, since the energy band bending direction due to the AC voltage is periodically changed in the p-type semiconductor 111 and the n-type semiconductor 112 so that the recoupling of the photoelectron and the hole due to the accumulation of charges may be suppressed.

According to an implementation example of the present disclosure, the hydrogen is generated from the surface of the p-type semiconductor 111 by a negative voltage which is applied from the AC power source 200 and the hydrogen may be coupled to the surface of the p-type semiconductor 111, but is not limited thereto.

With regard to this, it is confirmed that a part of the p-type semiconductor 111 exists on a surface of the semiconductor electrode 100 at all times.

According to an implementation example of the present disclosure, the hydrogen which is coupled onto the surface of the p-type semiconductor 111 may be released by a positive voltage which is applied from the AC power source 200, but it is not limited thereto.

According to an implementation example of the present disclosure, the hydrogen evolution apparatus 10 may simultaneously produce hydrogen and oxygen, but it is not limited thereto.

As it will be described below, when the positive voltage applied from the AC power source 200 is increased, the hydrogen evolution apparatus 100 may also produce oxygen. An oxygen producing process of the hydrogen evolution apparatus 10 may include a process of generating oxygen from the surface of the n-type semiconductor 112 by the positive voltage applied from the AC power source 200 and a process of releasing oxygen coupled onto the surface of the n-type semiconductor 112 by the negative voltage applied from the AC power source 200.

With regard to this, the hydrogen generated from the surface of the p-type semiconductor 111 and the oxygen generated from the surface of the n-type semiconductor 112 may be coupled to the surface of the p-type semiconductor 111 or the n-type semiconductor 112 as long as the direction of the voltage is not changed.

Figure 3:
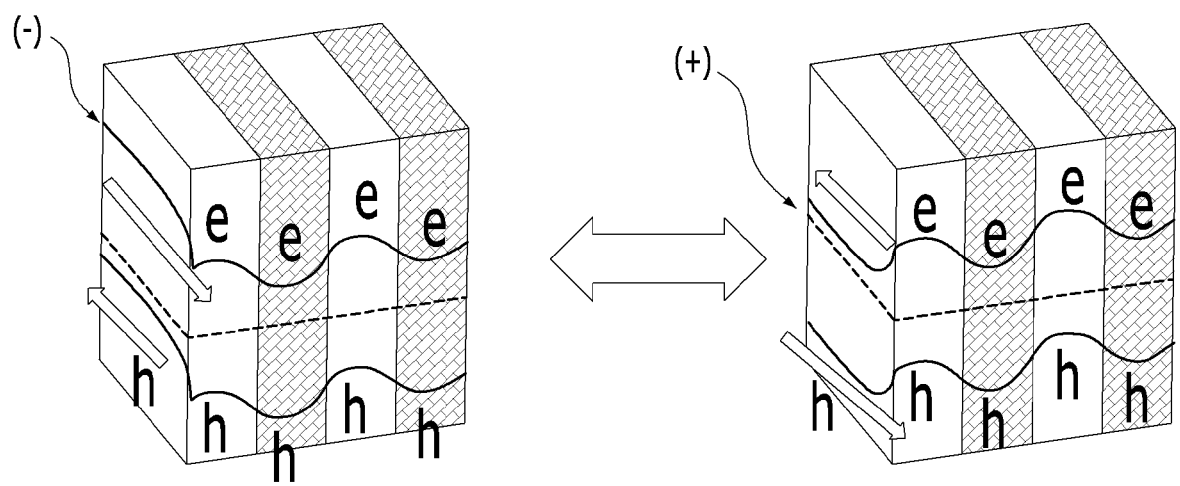
FIG. 3 is a mechanism of a hydrogen evolution apparatus according to one implementation example of the present disclosure.
Figure 4:
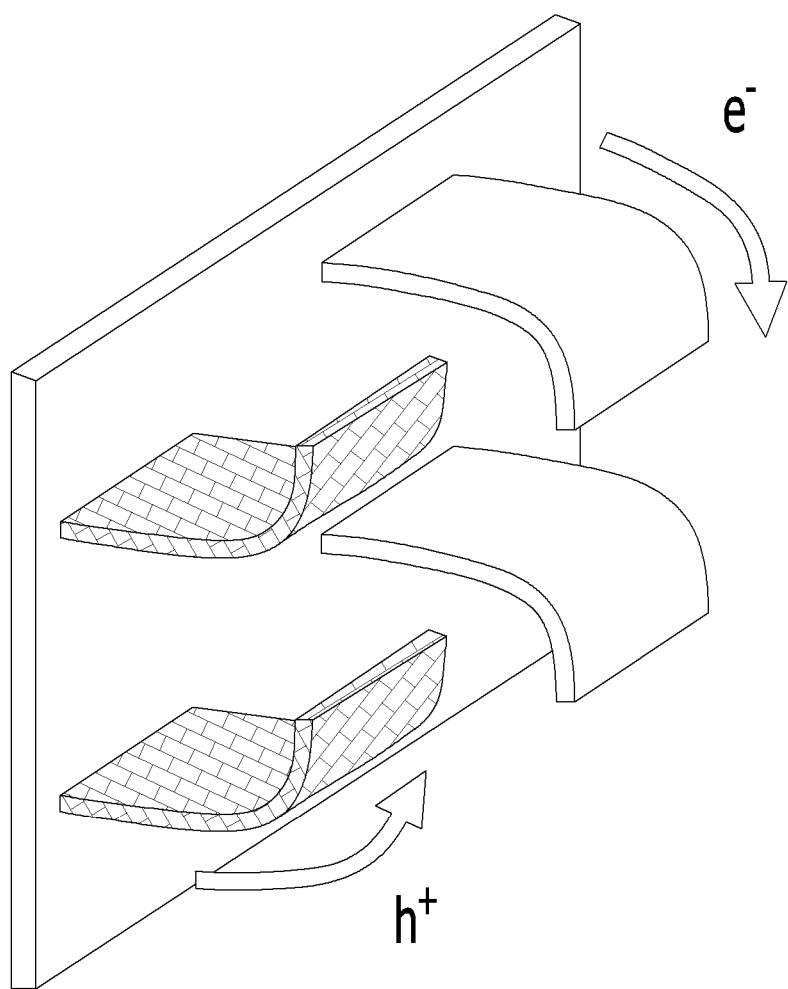
FIG. 4 is a mechanism of a semiconductor electrode according to an implementation example of the present disclosure.
Figure 5:
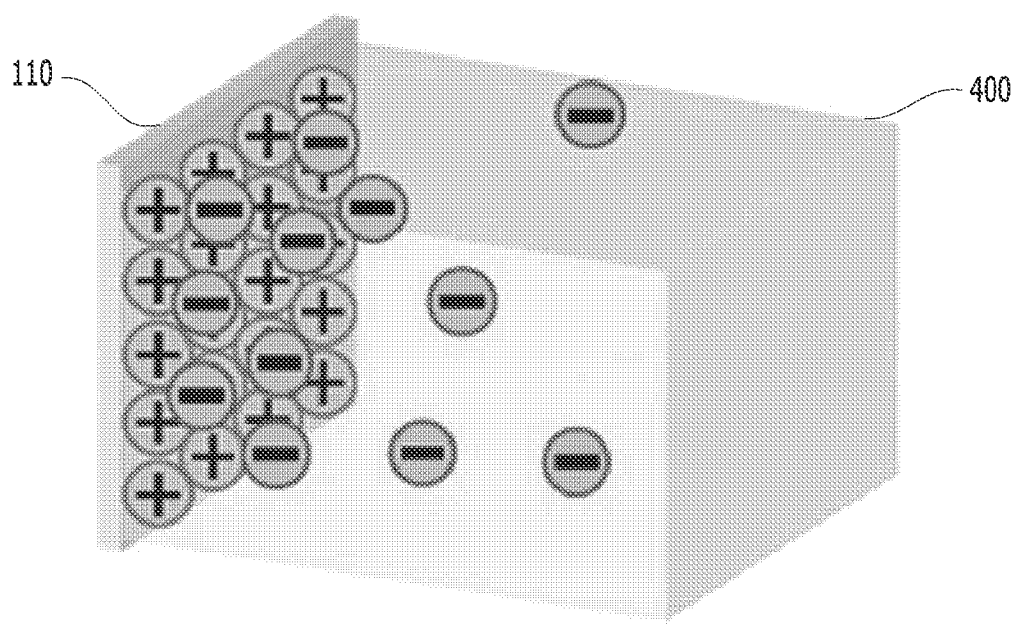
FIG. 5 is a diagram of an electrical double layer generated on an electrode surface according to an implementation example of the present disclosure.

FIG. 3 is a mechanism of a hydrogen evolution apparatus according to one implementation example of the present disclosure. FIG. 4 is a mechanism of a semiconductor electrode 100 according to an implementation example of the present disclosure. FIG. 5 is a diagram of an electrical double layer generated on a surface of a semiconductor electrode 100 according to an implementation example of the present disclosure.

With regard to this, even though FIG. 5 illustrates only the conductive substrate 110 of the semiconductor electrode 100 of the hydrogen evolution apparatus 10, the AC power source 200, the counter electrode 300, the n-type semiconductor 112, and the p-type semiconductor 111 are also provided.

Referring to FIGS. 3 to 5, when light is irradiated onto the semiconductor electrode 100 and a negative voltage is applied thereto, photoelectrons excited by the light may exist on the p-type semiconductor 111. $H^+$ ions in the electrolyte 400 in which the p-type semiconductor 111 of the semiconductor electrode 100 is immersed to be in contact therewith are reduced by the photoelectrons on the p-type semiconductor 111 to become hydrogen and the hydrogen may exist by being coupled onto the p-type semiconductor 111.

The hydrogen coupled onto the p-type semiconductor 111 may be released from the surface of the p-type semiconductor 111 by the positive voltage applied to the semiconductor electrode 100.

Further, when a positive voltage is applied to the semiconductor electrode 100, holes excited by the light exist on the n-type semiconductor 112 and $OH^-$ ions in the electrolyte 400 are oxidized by the n-type semiconductor 112 to form $O_2$ and $H^+$ ions.

Oxygen existing on the n-type semiconductor 112 may be released from the n-type semiconductor 112 by the negative voltage applied to the semiconductor electrode 100.

According to an implementation example of the present disclosure, the recoupling process of the electrons and holes may not be generated in the semiconductor electrode 100, but it is not limited thereto.

Referring to FIG. 3, when light with a predetermined intensity or higher is irradiated onto the semiconductor electrode 100, a depletion area is formed on the p-type semiconductor 111 or the n-type semiconductor 112. With regard to this, the depletion area refers to an area on the semiconductor electrode 100 where holes $h^+$ or electrons $e^-$ which are majority carriers do not exist.

If the depletion area on the p-type semiconductor 111 or the n-type semiconductor 112 is adjacent to the n-type semiconductor 112 or the p-type semiconductor 111, electrons generated in the n-type semiconductor 112 or the p-type semiconductor 111 move to the depletion area by the photoelectric effect. Therefore, a ratio at which the electrons and the holes are coupled onto the p-type semiconductor 111 and the n-type semiconductor 112 may be decreased.

According to an implementation example of the present disclosure, an energy source of the AC power source 200 may include an energy source selected from a group consisting of a solar cell, a piezoelectric device, a thermoelectric device, a triboelectricity, a photoelectric device, a ferrofluid, and a combination thereof, but is not limited thereto.

As described above, a voltage difference required to allow the hydrogen evolution apparatus 10 according to the present disclosure to produce hydrogen is approximately 1.23 V, which is low so that an electrical energy acquired by an energy harvesting method is sufficient.

The energy harvesting according to the present disclosure refers to a technology that produces electricity by collecting extra energy generated during an energy converting process in the modern society, such as vibration or sound energy. The energy harvesting may produce energy using a piezoelectric device which converts a pressure or vibration into an electrical energy, a thermoelectric device which converts heat such as a body temperature into an electrical energy, a triboelectricity which accumulates extra electricity such as static electricity, a photoelectric device which converts light into an electrical energy, and a ferrofluid which acquires an electrical energy by the change of a magnetic field generated by mixing and then vibrating fluid and magnetic particles.

According to an implementation example of the present disclosure, an energy source of the AC power source 200 may include an electrical energy transmitted from a general electric power station, but is not limited thereto.

Since the hydrogen evolution apparatus of the related art produces hydrogen by the DC power source, there are various problems such as corrosion of the electrode due to charges accumulated on the electrode over the time or reduction in a density of a photocurrent. However, since the hydrogen evolution apparatus 10 according to the present disclosure uses the AC power source 200, charges are not accumulated on the semiconductor electrode 100 and the problems such as the corrosion due to the DC power source or the reduction in the density of the photocurrent may be solved.

Further, the energy source of the DC power source of the hydrogen evolution apparatus of the related art is an AC power source supplied from the electric power station and the like so that a circuit which converts the AC power source into the DC power source is necessary. In contrast, the hydrogen evolution apparatus 10 according to the present disclosure may directly use the AC current so that the hydrogen evolution apparatus 10 may have a simple structure as compared with the hydrogen evolution apparatus of the related art.

According to an implementation example of the present disclosure, the conductive substrate 110 and the counter electrode 300 may independently include a material selected from a group consisting of Mo, Au, Pt, Ti, Ag, Ni, Zr, Ta, Zn, Nb, Cr, Co, Mn, Fe, Al, Mg, Si, W, Cu, lanthanum metals, nitrides thereof, oxides thereof, conductive polymers, and a combination thereof, but are not limited thereto.

According to an implementation example of the present disclosure, a wavelength of the irradiated light may be 300 nm to 900 nm, but is not limited thereto.

The light irradiated onto the semiconductor electrode 100 supplies an energy to excite the electrons on the p-type semiconductor 111 or the holes on the n-type semiconductor 112 which decompose the water.

A manufacturing method of a semiconductor electrode 100 according to an aspect of the present disclosure relates to a manufacturing method of a semiconductor electrode 100 of the hydrogen evolution apparatus 10 including a step of electrically depositing a first metal on the conductive substrate 110, a step of depositing a second metal on an upper edge of the first metal, and a step of producing a compound semiconductor (not illustrated) by performing a heat treatment on the first metal and the second metal in a selenium or sulfur atmosphere. An atomic composition ratio of the first metal and the second metal is 0.3 to 1.0.

The compound semiconductor according to the present disclosure refers to the n@p semiconductor matrix and/or the p@n semiconductor matrix and as it will be described below, includes the p-type semiconductor 111 matrix and the n-type semiconductor 112 matrix and the semiconductor electrode 100 includes the compound semiconductor and the conductive substrate.

A part of the hydrogen evolution apparatus 10 which produces hydrogen is the semiconductor electrode 100, specifically, the p-type semiconductor 111 of the semiconductor electrode 100. As described above, a voltage which is applied to the semiconductor electrode 100 is changed so that the n-type semiconductor 112 of the semiconductor electrode 100 may also produce oxygen.

FIG. 6 is a flowchart of a manufacturing method of a semiconductor electrode 100 according to an implementation example of the present disclosure.

In order to manufacture the semiconductor electrode 100 according to the present disclosure, a first metal is electrically deposited on the conductive substrate 110 (S100).

According to an implementation example of the present disclosure, the semiconductor electrode 100 may further include a substrate (not illustrated) and the conductive substrate 110 may be formed on the substrate, but it is not limited thereto.

According to an implementation example of the present disclosure, in the electrical depositing step, a voltage applied to the first metal may be −0.6 V to −0.3 V, but it is not limited thereto. For example, during the electrical depositing step, a voltage applied to the first metal may be approximately −0.6 V to approximately −0.3 V, approximately −0.5 V to approximately −0.3 V, approximately −0.4 V to approximately −0.3 V, approximately −0.6 V to approximately −0.5 V, approximately −0.6 V to approximately −0.4 V, or approximately −0.5 V to approximately −0.4 V, but it is not limited thereto.

With regard to this, the voltage applied to the first metal may be 0.3 V to 0.6 V which is merely obtained by reversely changing a direction of a voltage of −0.6 V to −0.3 V.

As it will be described below, when the voltage applied to the first metal is adjusted, a composition and a type of the compound semiconductor may be adjusted.

Next, the second metal is deposited on an upper edge of the first metal (S200).

According to an implementation example of the present disclosure, the first metal includes Cu or Zn and the second metal includes In or Sb, but are not limited thereto. For example, the first metal may be Cu and the second metal may be In, but are not limited thereto.

According to an implementation example of the present disclosure, the step of depositing the second metal may be performed by a process including a method selected from a group consisting of electrodeposition, chemical vapor deposition, physical vapor deposition, atomic layer deposition, and a combination thereof, but is not limited thereto. For example, the depositing step is performed by the electrodeposition, but is not limited thereto.

According to an implementation example of the present disclosure, the first metal and the second metal have a thickness gradient, but are not limited thereto.

FIG. 7 is a diagram illustrating a manufacturing method of a semiconductor electrode according to an implementation example of the present disclosure.

Referring to FIG. 7, the first metal Cu formed on the conductive substrate 110 (Mo) has a bowl shape in which a center portion is thin and a portion closer to the edge has a larger thickness. Further, contrary to the first metal, the second metal In formed on the first metal has a shape in which a center portion is thick, and a portion closer to the edge has a smaller thickness.

When the first metal and the second metal are deposited on the conductive substrate 110 by the electrodeposition, the first metal and the second metal have different thicknesses, that is, a thickness gradient according to the position by a current channeling effect of the conductive substrate 110.

As it will be described below, the compound semiconductor may be formed by alternately disposing the p-type semiconductors 111 and the n-type semiconductors 112 by the thickness gradient of the first metal and the second metal.

According to an implementation example of the present disclosure, an atomic composition ratio of the first metal and the second metal may be 0.3 to 1.0, but it is not limited thereto.

For example, when the first metal is Cu, the second metal is In, and an atomic composition ratio of Cu and In is less than 0.3, the CIS based compound which forms the n-type semiconductor 112 may be $CuIn_5Se_8$, which is less efficient than $CuIn_3Se_5$. Further, when the atomic composition ratio of Cu and In exceeds 1.0, instead of the n-type semiconductor 112, a $Cu_2Se$ semiconductor matrix may be formed, but the $Cu_2Se$ may not perform a function as the n-type semiconductor 112.

Next, the first metal and the second metal are subjected to the heat treatment in the selenium or sulfur atmosphere to produce the compound semiconductor (S300).

The selenium or sulfur atmosphere according to the present disclosure refers to an atmosphere where a selenium or sulfur layer is deposited on the first metal and the second metal or selenium or sulfur gas is supplied to the first metal and the second metal.

According to an implementation example of the present disclosure, during the heat treatment process, selenium or sulfur may not be additionally supplied, but is not limited thereto.

According to an implementation example of the present disclosure, the compound semiconductor may include a material selected from a group consisting of a Cu—In—Se based material, a Cu—In—S based material, a Cu—Sb—Se based material, a Cu—Sb—S based material, a Zn—In—Se based material, a Zn—In—S based material, a Zn—Sb—Se based material, a Zn—Sb—S based material, and a combination thereof, but is not limited thereto.

According to an implementation example of the present disclosure, the compound semiconductor may include n-type semiconductor 112 particles dispersed on the p-type semiconductor 111 matrix or p-type semiconductor 111 particles dispersed on the n-type semiconductor 112 matrix, but is not limited thereto.

According to an implementation example of the present disclosure, the compound semiconductor may have a three-dimensional heterojunction structure in which the n-type semiconductor 112 matrix and the p-type semiconductor 111 matrix are alternately disposed, but is not limited thereto. For example, the compound semiconductor may include a structure in which the p-type semiconductors 111 and the n-type semiconductors 112 are alternately disposed, a structure in which the n@p semiconductor matrix and the p@n semiconductor matrix are alternately disposed, a structure in which the p-type semiconductors 111 and the p@n semiconductor matrix are alternately disposed, or a structure in which the n-type semiconductors 112 and the n@p semiconductor matrix are alternately disposed.

According to an implementation example of the present disclosure, a heat treatment temperature may be 450° C. to 650° C., but is not limited thereto.

In order to form the compound semiconductor according to the related art, when two different metals or one metal is heated through multiple steps, the compound semiconductor of the related art is uniformly crystallized over the entire area and a phase thereof is unified so that the compound semiconductor of the related art has a single phase. As described above, there is a problem in that the compound semiconductor with a single phase is easily corroded due to the electrical double layer.

In order to form the semiconductor electrode 100 according to the present disclosure, when the first metal and the second metal are subjected to rapid heat treatment with selenium or sulfur, the uniformity of the crystallization is reduced unlike the forming method of the compound semiconductor of the related art and a phase unification effect is suppressed so that the compound semiconductor does not have a single phase. Accordingly, the compound semiconductor simultaneously has the p-type semiconductor 111 and the n-type semiconductor 112 which are heterogeneous phases existing on a thermodynamic state diagram and the thickness gradient may induce improvement of the entropy to allow the compound semiconductor to have a polyphase.

Hereinafter, the present disclosure will be described in more detail with respect to examples, but the following examples are set forth to illustrate, but are not to be construed to limit the scope of the present disclosure.

EXAMPLE

A Mo electrode was formed on a glass substrate and a voltage of −0.6 V to −0.3 V was applied by means of an electrodeposition process to deposit Cu. Next, after vertically depositing In on Cu, Se was vacuum-deposited on the Cu—In column at a room temperature.

Next, after rising a temperature at a rate of 27° C./minute while additionally supplying Se, the Cu—In column was selenized and recrystallized at 550° C. without supplying Se to manufacture a semiconductor electrode in which Cu—In—Se based compound of an n-type semiconductor and Cu—In—Se based compound of a p-type semiconductor are alternately disposed.

Next, after connecting the semiconductor electrode to an AC power source, the semiconductor electrode was immersed in the water to create a hydrogen generation atmosphere.

FIG. 8 is a TEM image and a selected area electron diffraction (SAED) image of a semiconductor electrode according to the exemplary embodiment.

Referring to FIG. 8, it is confirmed that the semiconductor electrode simultaneously includes a p-type $CuInSe_2$ and an n-type $CuIn_2Se_5$ and two materials are distinguished from each other.

Figure 9:
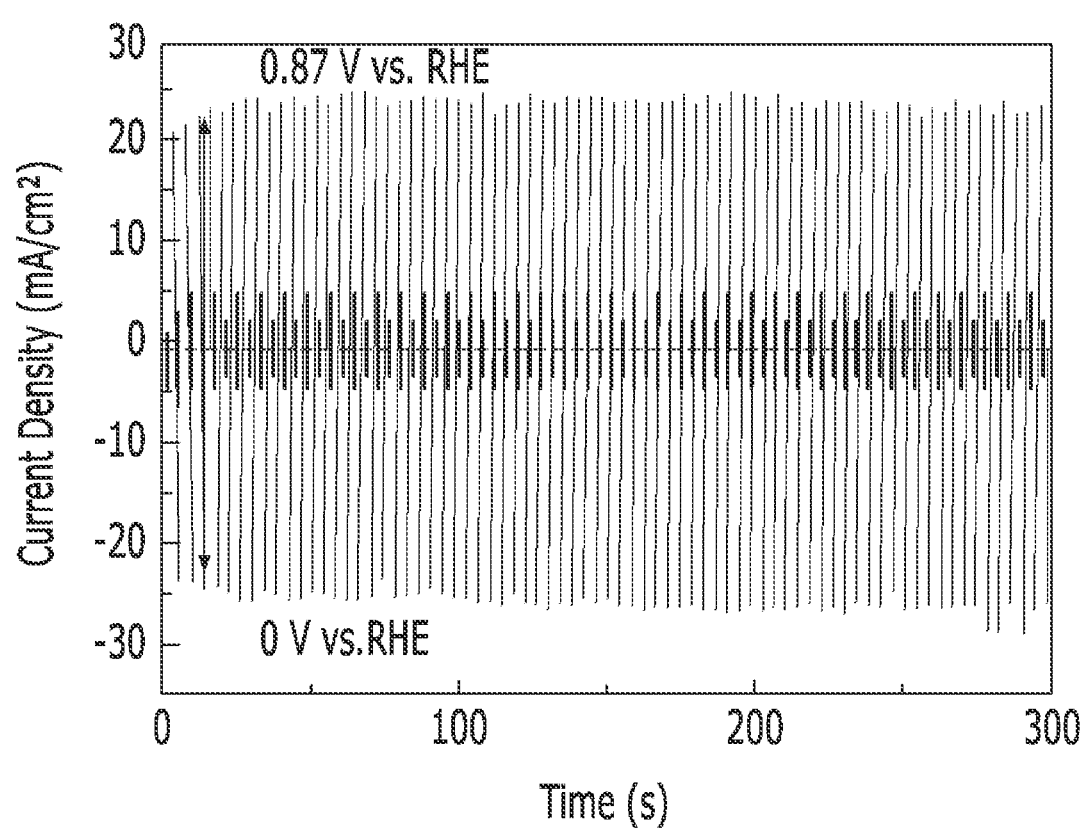
FIG. 9 is a graph illustrating an efficiency of a hydrogen evolution apparatus according to an exemplary embodiment of the present disclosure.

FIG. 9 is a graph illustrating an efficiency of a hydrogen evolution apparatus according to the exemplary embodiment.

Referring to FIG. 9, a voltage applied to the hydrogen evolution apparatus is −0.57 V and +0.3 V and a photocurrent density is constantly maintained over the time so that it is confirmed that the hydrogen evolution apparatus consistently produces hydrogen.

Experimental Example 1

Figure 10:
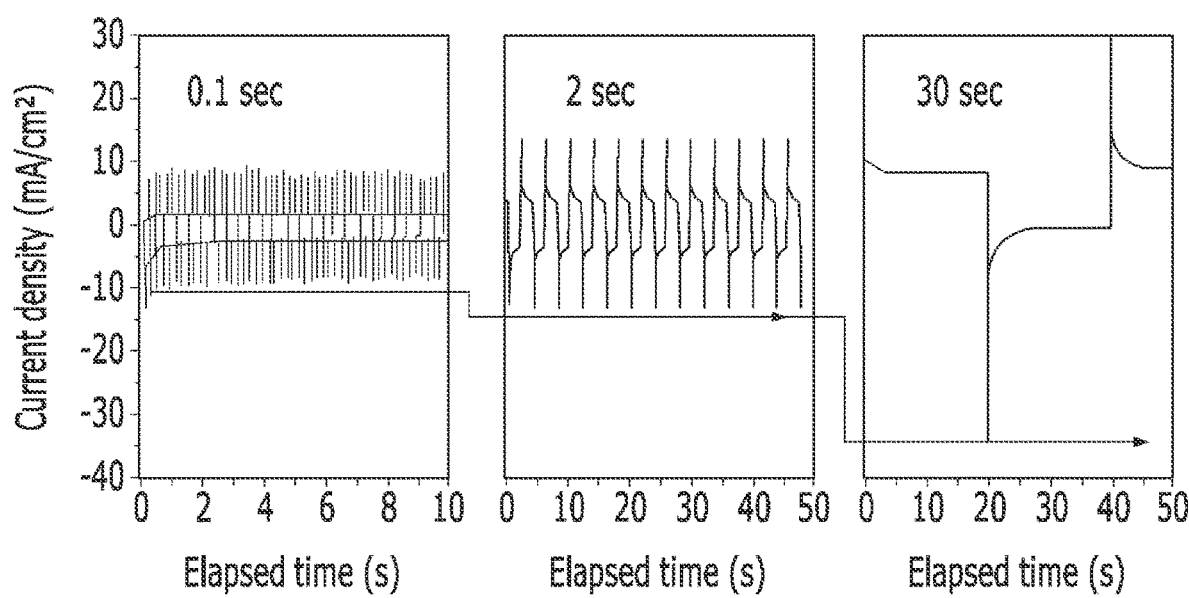
FIG. 10 is a graph illustrating a relationship between a hydrogen evolution efficiency of a hydrogen evolution apparatus according to an exemplary embodiment of the present disclosure and a frequency of an AC voltage.

FIG. 10 is a graph illustrating a relationship between a hydrogen evolution efficiency of a hydrogen evolution apparatus according to the exemplary embodiment and a frequency of an AC voltage.

With regard to this, in FIG. 10, when a frequency of the applied voltage is 10 Hz, a current density is approximately 10 mA/cm$^2$, when a frequency of the applied voltage is 0.5 Hz, a current density is approximately 15 mA/cm$^2$, and when a frequency of the applied voltage is 1/30 Hz, a current density is approximately 30 mA/cm$^2$.

Referring to FIG. 10, the smaller the change in the voltage applied to the hydrogen evolution apparatus, that is, the lower the frequency of the voltage, the longer the time when the charges maintain in the electrode so that the current density on the electrode may be improved, which may result in the improvement of a hydrogen evolution efficiency.

Experimental Example 2

Figure 11:
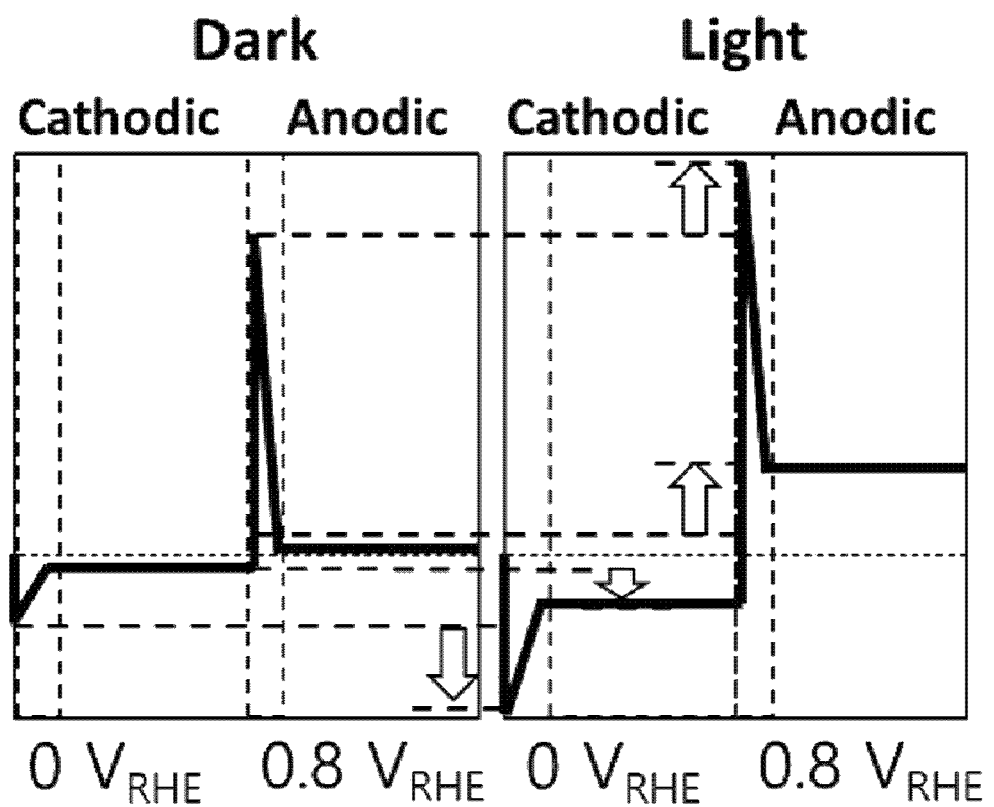
FIG. 11 is a graph illustrating a relationship between a hydrogen evolution efficiency of a hydrogen evolution apparatus according to an exemplary embodiment of the present disclosure and whether to irradiate light.

FIG. 11 is a graph illustrating a relationship between a hydrogen evolution efficiency of a hydrogen evolution apparatus according to an exemplary embodiment of the present disclosure and whether to irradiate light.

Referring to FIG. 11, it is confirmed that when light is irradiated onto the hydrogen evolution apparatus, a hydrogen evolution efficiency is increased.

Experimental Example 3

Figure 12:
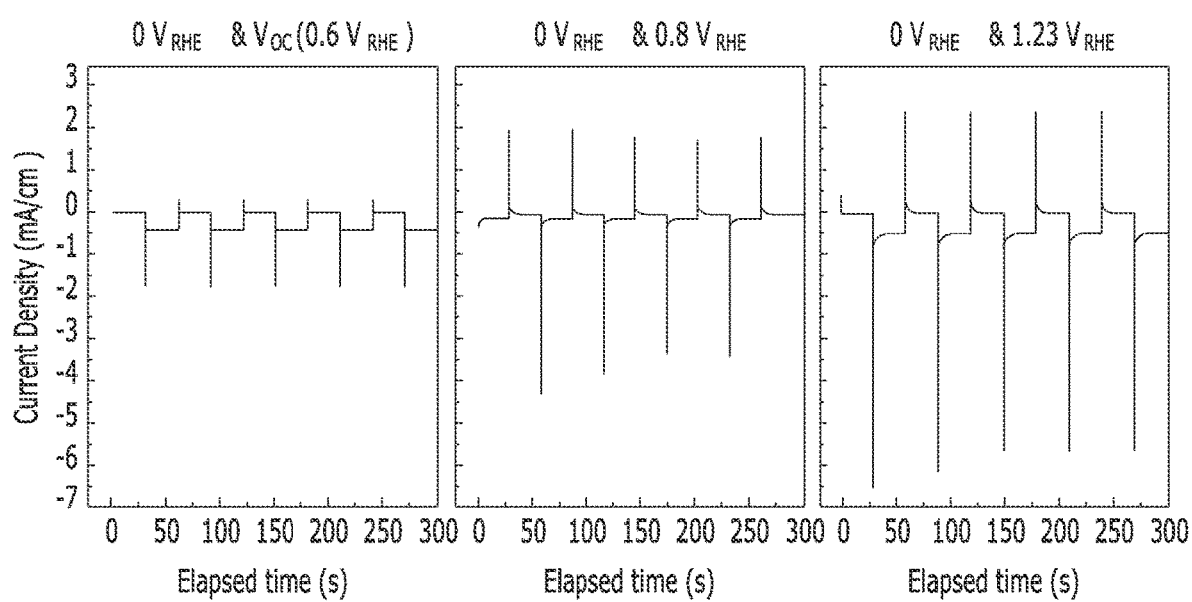
FIG. 12 is a graph illustrating a relationship between a voltage applied to a hydrogen evolution apparatus according to an exemplary embodiment of the present disclosure and a hydrogen evolution efficiency.

FIG. 12 is a graph illustrating a relationship between a voltage applied to a hydrogen evolution apparatus according to an exemplary embodiment of the present disclosure and a hydrogen evolution efficiency.

Referring to FIG. 12, when a voltage for hydrogen evolution is fixed to −0.5 V, the larger the range of the opposite voltage, the higher the current density for hydrogen evolution. Further, even though the difference in the range of the AC voltage is 1.23 V or lower, the hydrogen may be generated. Furthermore, the larger the range of the AC voltage, the higher the hydrogen evolution efficiency.

From the results of Experimental Examples 1 to 3, it is confirmed that under an environment where light is irradiated, when a voltage with a large range and a lower frequency is applied onto the hydrogen evolution apparatus according to the present disclosure, the hydrogen is actively generated.

Experimental Example 4

Figure 13:
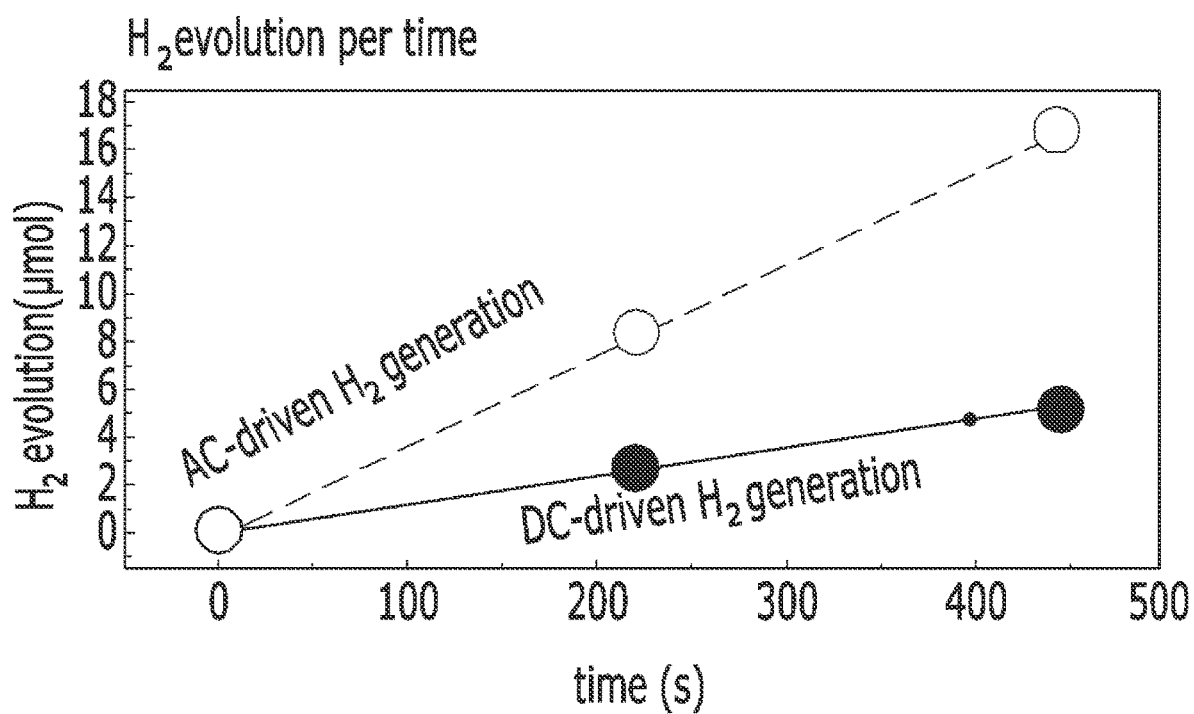
FIG. 13 is a graph illustrating the hydrogen evolution in accordance with a time that applies an AC voltage or a DC voltage to a semiconductor electrode according to an exemplary embodiment of the present disclosure.

FIG. 13 is a graph illustrating the hydrogen evolution in accordance with a time when an AC voltage or a DC voltage is applied to a semiconductor electrode according to the exemplary embodiment.

Referring to FIG. 13, when the AC voltage or the DC voltage is applied to the semiconductor electrode, hydrogen may be generated. However, it is confirmed that when the AC voltage is applied to the semiconductor electrode, more hydrogen may be obtained than when the DC voltage is applied to the semiconductor electrode as in the hydrogen evolution apparatus of the related art.

The above-description of the present disclosure is illustrative only and it is understood by those skilled in the art that the present disclosure may be easily modified to another specific type without changing the technical spirit of an essential feature of the present disclosure. Thus, it is to be appreciated that embodiments described above are intended to be illustrative in every sense, and not restrictive. For example, each component which is described as a singular form may be divided to be implemented and similarly, components which are described as a divided form may be combined to be implemented.

The scope of the present disclosure is represented by the claims to be described below rather than the detailed description, and it is to be interpreted that the meaning and scope of the claims and all the changes or modified forms derived from the equivalents thereof come within the scope of the present disclosure.

What is claimed is:

1. A hydrogen evolution apparatus, comprising:
    an AC power source;
    a semiconductor electrode and a counter electrode connected to the AC power source;
    an electrolyte in which the semiconductor electrode is immersed; and
    a light source which irradiates light on the semiconductor electrode,
        wherein the semiconductor electrode includes a conductive substrate and an n-type semiconductor and/or a p-type semiconductor which is vertically grown from the conductive substrate,
    wherein the semiconductor electrode includes n-type semiconductor particles dispersed on a p-type semiconductor matric or p-type semiconductor particles dispersed on an n-type semiconductor matrix, and
    wherein the semiconductor electrode has a three-dimensional heterojunction structure in which the n-type semiconductor matrix and the p-type semiconductor matric are alternately disposed.

2. The hydrogen evolution apparatus according to claim 1, wherein the semiconductor electrode has a three-dimensional heterojunction structure in which the n-type semiconductor and the p-type semiconductor are alternately disposed.

3. The hydrogen evolution apparatus according to claim 1, wherein the n-type semiconductor and the p-type semiconductor independently include a material selected from a group consisting of a Cu—In—Se based material, a Cu—In—S based material, a Cu—Sb—Se based material, a Cu—Sb—S based material, a Zn—In—Se based material, a Zn—In—S based material, a Zn—Sb—Se based material, a Zn—Sb—S based material, and a combination thereof.

4. The hydrogen evolution apparatus according to claim 3, wherein in the n-type semiconductor, a composition ratio of Cu—In—Se is 1:3:5 and in the p-type semiconductor, a composition ratio of Cu—In—Se is 1:1:2.

5. The hydrogen evolution apparatus according to claim 1, wherein the AC power source applies a voltage of −1.0 V to +1.5 V onto the conductive substrate.

6. The hydrogen evolution apparatus according to claim 1, wherein hydrogen is generated on the electrolyte by light irradiated from the light source and/or a voltage applied to the semiconductor electrode.

7. The hydrogen evolution apparatus according to claim 1, wherein hydrogen is generated from a surface of the p-type semiconductor by a negative voltage applied from the AC power source and the hydrogen is coupled onto the surface of the p-type semiconductor.

8. The hydrogen evolution apparatus according to claim 7, wherein the hydrogen coupled onto the surface of the p-type semiconductor is released by a positive voltage applied from the AC power source.

9. The hydrogen evolution apparatus according to claim 8, wherein a frequency of the AC power source is 0.01 Hz to 30 Hz.

10. The hydrogen evolution apparatus according to claim 1, wherein the conductive substrate and the counter electrode independently include a material selected from a group consisting of Mo, Au, Pt, Ti, Ag, Ni, Zr, Ta, Zn, Nb, Cr, Co, Mn, Fe, Al, Mg, Si, W, Cu, lanthanum metals, nitrides thereof, oxides thereof, conductive polymers, and a combination thereof.

11. The hydrogen evolution apparatus according to claim 1, wherein an energy source of the AC power source includes an energy source selected from a group consisting of a solar cell, a piezoelectric device, a thermoelectric device, a triboelectricity, a photoelectric device, a ferrofluid and a combination thereof.

12. The hydrogen evolution apparatus according to claim 1, wherein a wavelength of the irradiated light is 300 nm to 900 nm.

13. A manufacturing method of a semiconductor electrode of the hydrogen evolution apparatus according to claim 1, comprising:
   electrically depositing a first metal on the conductive substrate;
   depositing a second metal on an upper edge of the first metal; and
   performing heat treatment on the first metal and the second metal in a selenium or sulfur atmosphere to produce a compound semiconductor,
   wherein an atomic composition ratio of the first metal and the second metal is 0.3 to 1.0.

14. The manufacturing method of a semiconductor electrode according to claim 13, wherein during the electrically depositing of a first metal, a voltage applied to the first metal is −0.6 V to −0.3 V.

15. The manufacturing method of a semiconductor electrode according to claim 13, wherein the first metal includes Cu or Zn and the second metal includes In or Sb.

16. The manufacturing method of a semiconductor electrode according to claim 13, wherein the compound semiconductor includes a material selected from a group consisting of a Cu—In—Se based material, a Cu—In—S based material, a Cu—Sb—Se based material, a Cu—Sb—S based material, a Zn—In—Se based material, a Zn—In—S based material, a Zn—Sb—Se based material, a Zn—Sb—S based material, and a combination thereof.

17. The manufacturing method of a semiconductor electrode according to claim 13, wherein the depositing of a second metal is performed by a process including a method selected from a group consisting of electrodeposition, chemical vapor deposition, physical vapor deposition, atomic layer deposition, and a combination thereof.

18. The manufacturing method of a semiconductor electrode according to claim 13, wherein a heat treatment temperature is 450° C. to 650° C.

* * * * *